(12) United States Patent
Skodje et al.

(10) Patent No.: US 11,709,183 B2
(45) Date of Patent: *Jul. 25, 2023

(54) SELF FLATTENING TEST SOCKET WITH ANTI-BOWING AND ELASTOMER RETENTION

(71) Applicant: Johnstech International Corporation, Minneapolis, MN (US)

(72) Inventors: David T. Skodje, Minneapolis, MN (US); Michael W. Andres, Inver Grove Heights, MN (US); Jeffrey C. Sherry, Savage, MN (US)

(73) Assignee: Johnstech International Corporation, Minneapolis, MN (US)

(*) Notice: Subject to any disclaimer, the term of this patent is extended or adjusted under 35 U.S.C. 154(b) by 306 days.

This patent is subject to a terminal disclaimer.

(21) Appl. No.: 17/007,423

(22) Filed: Aug. 31, 2020

(65) Prior Publication Data

US 2020/0400718 A1   Dec. 24, 2020

Related U.S. Application Data

(63) Continuation of application No. 16/124,700, filed on Sep. 7, 2018, now Pat. No. 10,761,112.

(60) Provisional application No. 62/556,942, filed on Sep. 11, 2017.

(51) Int. Cl.
*G01R 1/073* (2006.01)

(52) U.S. Cl.
CPC .................. *G01R 1/07342* (2013.01)

(58) Field of Classification Search
CPC .................. G01R 1/07342; G01R 1/0466
See application file for complete search history.

(56) References Cited

U.S. PATENT DOCUMENTS

| 5,069,629 | A | 12/1991 | Johnson |
| 5,947,749 | A | 9/1999 | Rathbum |
| 7,338,293 | B2 | 3/2008 | Gilk |
| 7,632,106 | B2* | 12/2009 | Nakamura ............ G01R 1/0466 439/71 |
| 9,274,141 | B1* | 3/2016 | Andres .............. G01R 31/2887 |
| 10,761,112 | B1* | 9/2020 | Skodje ................. G01R 1/0466 |

* cited by examiner

*Primary Examiner* — Lee E Rodak
(74) *Attorney, Agent, or Firm* — Hamre, Mueller & Larson, P.C.

(57) ABSTRACT

A high density thin walled test device testing chips/ICs is disclosed. A housing includes a slot for a contact pin and a pair of elastomers. The pin has an arcuate recess to receive part of the elastomer. Likewise the housing includes a channel to receive part of the elastomer. The recess and channel together partially surround the elastomer but not completely to allow shear forces and expansion space for the elastomer as it is compressed by the channel and recess. In addition, a front channel extends from the top surface of the housing toward the bottom surface but leaving a floor to support the elastomer so that it does not warp the housing when compressed. Further, the channel or the recess may include retainers which prevent the elastomer from moving out of position when the pin is in an uncompressed state.

15 Claims, 16 Drawing Sheets

SELF FLATTENING TEST SOCKET WITH ANTI-BOWING AND ELASTOMER RETENTION

TECHNICAL FIELD

This disclosure relates to the field of microcircuit/IC testing devices, more particularly, a test socket for testing integrated circuit chips.

BACKGROUND

Microcircuits are well known electrical components that combine hundreds or thousands of individual circuit components and connections in a small volume. The package that holds a typical microcircuit may be no larger than 5 mm. square by 0.5 mm thick. One common type of container for a microcircuit called a leadless package, has small connector or contact pads along the periphery of one surface of the package. A single package may have several dozen contact pads by which power is supplied to the microcircuits and signals sent to and from the microcircuit. The contact pads are soldered onto the conductors of a circuit board during assembly of the electrical device.

Before a microcircuit is soldered onto a circuit board, the microcircuit must be tested to assure design functionality. Soldering a defective microcircuit onto a circuit board often ruins the entire board, since typically it is either not possible or not economic to remove a defective microcircuit from a circuit board. Since typical microcircuits are the result of a complex manufacturing process, testing is essential to assure that every microcircuit is completely functional.

For a number of reasons, testing these microcircuits is complex. In the first place, one should not solder the microcircuits to be tested into the test fixture because the act of removing the microcircuits when testing is complete might itself damage the microcircuit.

Secondly, the microcircuits are small and the contacts are closely spaced, on perhaps as small as a 0.3 mm pitch or smaller. The contacts themselves may be as small as 0.05 mm wide for accurate testing; the test fixture contacts must make reliable, low-resistance contact with each of the microcircuit contacts during the entire test process, which may extend to even many hours. Failure to make proper contact with each microcircuit contact for the entire test sequence results in a test that incorrectly fails the microcircuit.

While it is important to test each microcircuit thoroughly, it is also important to test them quickly and cheaply. Accordingly, automated testers have been developed that operate with little human intervention to reliably test hundreds or thousands of individual microcircuits per hour.

A typical tester has its own circuit board with one or more arrays of test contacts that are spaced and aligned to make temporary mechanical contact with the connector pads on the microcircuit package. Each test socket contact is designed to resiliently deflect a very small amount when force is applied. This accommodates any dimensional variations in either the microcircuit package or the test socket contacts.

An alignment plate is mounted on the tester circuit board with an aperture that receives and precisely positions each microcircuit to be tested so that each of the microcircuit contact pads is in precise alignment with the corresponding test contact. The alignment plate is typically bolted to the contactor which is mounted to tester circuit board.

To assure reliable and low resistance electrical conduction between each test socket contact and the corresponding microcircuit contact, the tester includes a presser or loader element that applies sufficient force to the microcircuit package so that each of the microcircuit package contacts at least slightly deflects the corresponding test socket contact. For example, if the test procedure requires 50 grams of force between each package contact and each tester contact, a package with 100 contacts will then require 5 kg. of force for proper electrical connection between each of the microcircuit contacts and the corresponding tester contact.

Some semiconductor devices operate at very high frequencies. In order to test them, higher performance contacts are needed. One method to improve the performance of a contact is to make it shorter and/or thinner. When the contact gets shorter, the housing must become thinner. This makes the housing more fragile and flexible. With a relatively thick housing, the contacts can easily be pre-loaded (i.e. applying a bias force to maintain the pin in one position) so that there is sufficient force and pressure to make reliable electrical connections to the load board and the Device Under Test (DUT). With a thin housing, pre-load force applied to the contacts may actually bend the housing and cause dimensional problems. If there is no pre-load on the contacts, it becomes difficult to produce sufficient forces on the contacts to make reliable electrical connections with the DUT and load board, so that is not a practical solution. As contacts get smaller for higher frequencies, the problem is exacerbated, because the pin doesn't move very far during compression and thus the pre-loading must be greater, that can distort (warp) the housing during insertion and test.

BRIEF SUMMARY

The following summary is intended to assist the reader in understanding some aspects of the disclosure. It does not define the scope of the invention. Please refer to the claims for that.

The above mentioned distortion problems cause bowing of the housing, which in turn, causes misalignment, incorrect bias pressure and other problems with the actual test. Three main solutions are disclosed in this document: solution 1) cut the slot for the front elastomer into the top of the housing, rather than the bottom, so that a rigid floor remains on the housing below the elastomer. This reduces bowing of the housing. Solution 2) cut/form the pin slot so that there is a bridge between the two sidewalls of the housing at the bottom thereof. This means that the slot is not "wide open" as in prior designs and it also provides box frame rigidity to the housing. Solution 3) a pin profile (shape) which has a radial-like upper portion and a flattened lower portion. Also a pin and housing having a vertical tail stop to reduce force due to tail stop-tail friction which causes bowing (FIGS. 18, 19), or we could list the housing without a rear elastomer because it reduces preload significantly which in turn reduces housing bow (FIGS. 15-17). Other solutions are detailed herein.

The problem of retaining the elastomer in their proper position is solved by providing a recess in the pin which includes a protrusion at its end. This recess is arcuate except at the end of the recess where it has a small extension which engages the elastomer by indenting it slightly to maintain a grip or pinch the elastomer.

There is also disclosed an apparatus for electrically connecting a lead of an integrated circuit device to be tested (DUT) to a corresponding terminal of a load board at a test site, comprising any or all of the following:

a. a housing having upper and lower surfaces, a first surface approachable by an integrated circuit device under test (DUT) to be tested and a second surface proximate the load board;
b. a slot extending through said housing from the first surface to the second surface;
c. a pin contact receivable in said slot having a first end engagable by the lead and a second end in engagement with the terminal, said pin contact being movable between a first orientation unengaged by the lead of the integrated circuit and a second orientation in which said first end of said contact is engaged by the lead of the integrated circuit and urged into said slot;
d. at least one elastomeric bias element;
e. said pin contact including an arcuate recess therein sized generally to receive a portion of said bias element, said arcuate recess having distal terminations at ends of the recess, at least one of said terminations including a projection which narrows the opening of the recess, thereby providing a retainer to maintain the bias element within the recess;
f. said housing including a channel sized to receive a portion of said bias element, said channel extending from said upper surface toward but not up to said lower surface, thereby defining a housing support portion at the bottom of said channel;
g. said channel being arcuate in shape and having a circumference less than half of the circumference of said bias element thereby creating a gap around the bias element;
wherein, as said pin contact is moved between said first and second orientations thereof, compressing said bias element between said channel and said arcuate recess applying compressive forces on the elastomer but also allowing for shear forces thereon in said gap.

Also disclosed is an apparatus wherein the channel is configured to receive said elastomer from the upper surface of the housing.

Also disclosed is an apparatus wherein the projection is a protruding bump sized to assist in retaining said elastomer in said recess.

Also disclosed is an apparatus having a recess for receiving and wherein the pin includes a tail end, and wherein the recess engages a portion of said tail end when said pins are engaged by the DUT, the housing adjacent said recess being deflectable in response to engagement of said tail end; said recess includes an elastomer configured to engage at least a portion of said tail end when said pin is deflected by the DUT.

Also disclosed is an apparatus wherein the recess includes an elastomer configured to engage at least a portion of said tail end when said pin is deflected by the DUT and where the elastomer resides in said recess but is smaller than said recess until engaged by said tail end, thereby expanding the elastomer to fill the recesses space.

Also disclosed is an apparatus wherein the recess includes an elastomer and wherein the elastomer has a non-linear force response to engagement with said tail end.

Also disclosed is an apparatus wherein the housing adjacent said recess includes a flexible portion.

Also disclosed is an apparatus wherein the flexible portion includes an arcuate portion.

Also disclosed is an apparatus wherein the arcuate portion is a convex portion not in contact with the load board.

Also disclosed is an apparatus wherein the arcuate portion is a concave portion adjacent to the load board.

Also disclosed is an apparatus for electrically connecting a lead of an integrated circuit device to be tested (DUT) to a corresponding terminal of a load board at a test site, comprising any or all of the following elements:
a. a housing having upper and lower surfaces, a first surface approachable by an integrated circuit device under test (DUT) to be tested and a second surface proximate the load board;
b. a slot extending through said housing from the first surface to the second surface;
c. a pin contact receivable in said slot having a first end engagable by the lead and a second tail end in engagement with the terminal, said pin contact being movable between a first orientation unengaged by the lead of the integrated circuit and a second orientation in which said first end of said contact is engaged by the lead of the integrated circuit and urged into said slot;
d. at least one elastomeric bias element;
e. said housing including a channel sized to receive a portion of said bias element, said channel extending from said upper surface toward but not up to said lower surface, thereby defining a housing support portion at the bottom of said channel;
f. said housing including a recess for receiving and engaging a portion of said tail end when said pins are engaged by the DUT, the housing adjacent said recess being deflectable in response to engagement of said tail end;
so that when said recess is deflected in response to pin movement, contact between the housing and the load board is maintained.

Also disclosed is an apparatus wherein the recess includes an elastomer configured to engage at least a portion of said tail end when said pin is deflected by the DUT.

Also disclosed is an apparatus wherein the recess includes an elastomer configured to engage at least a portion of said tail end when said pin is deflected by the DUT and where the elastomer resides in said recess but is smaller than said recess until engaged by said tail end, thereby expanding the elastomer to fill the recesses space.

Also disclosed is an apparatus wherein the recess includes an elastomer and wherein the elastomer has a non-linear force response to engagement with said tail end.

Also disclosed is an apparatus wherein the housing adjacent said recess includes a flexible portion.

Also disclosed is an apparatus wherein the flexible portion includes an arcuate portion.

Also disclosed is an apparatus wherein the arcuate portion is a convex portion not in contact with the load board.

Also disclosed is an apparatus wherein the arcuate portion is a concave portion adjacent to the load board.

Also disclosed is a method of making an integrated circuit testing device which connects terminals on a device under test (DUT) to a corresponding terminal of a load board at a test site, comprising any or all of the steps in any order:
a. forming a housing having upper and lower surfaces, a first surface approachable by an integrated circuit device under test (DUT) to be tested and a second surface proximate the load board;
b. forming a slot extending through said housing from the first surface to the second surface;
c. inserting a pin contact in said slot having a first end engagable by the lead and a second end in engagement with the terminal, said pin contact being movable between a first orientation unengaged by the lead of the integrated circuit and a second orientation in which said first end of said contact is engaged by the lead of the integrated circuit and urged into said slot;
d. forming at least one elastomeric bias element;

e. forming an arcuate recess in said pin contact and sizing it generally to receive a portion of said bias element, forming distal terminations at ends of the recess, at least one of said terminations including a projection which narrows the opening of the recess, thereby providing a retainer to maintain the bias element within the recess;

f. forming a channel in said housing, the channel formed sized to receive a portion of said bias element, said channel extending from said upper surface toward but not up to said lower surface, thereby defining a housing support portion at the bottom of said channel;

g. forming the channel in an arcuate shape and having a circumference less than half of the circumference of said bias element thereby creating a gap around the bias element;

wherein, as said pin contact is moved between said first and second orientations thereof, compressing said bias element between said channel and said arcuate recess applying compressive forces on the elastomer but also allowing for shear forces thereon in said gap.

Also disclosed is an apparatus for testing an integrated circuit by electrically connecting a lead of an integrated circuit device to be tested (DUT) to a corresponding terminal of a load board at a test site, comprising any or all of the following elements:

a. a housing having upper and lower surfaces, a first surface approachable by an integrated circuit device under test (DUT) to be tested and a second surface proximate the load board;

b. a slot extending through said housing from the first surface to the second surface;

c. a pin contact receivable in said slot having a first end engagable by the lead and a second end in engagement with the terminal, said pin contact being movable between a first orientation unengaged by the lead of the integrated circuit and a second orientation in which said first end of said contact is engaged by the lead of the integrated circuit and urged into said slot;

d. at least one elastomeric bias element;

e. said pin contact including an arcuate recess therein sized generally to receive a portion of said bias element, said arcuate recess having distal terminations at ends of the recess, at least one of said terminations including a projection which narrows the opening of the recess, thereby providing a retainer to maintain the bias element within the recess;

f. said housing including a channel sized to receive a portion of said bias element, said channel extending from said upper surface toward but not up to said lower surface, thereby defining a housing support portion at the bottom of said channel;

g. said channel being arcuate in shape:

wherein, as said pin contact is moved between said first and second orientations thereof, compressing said bias element between said channel and said arcuate recess applying compressive forces on the elastomer but also allowing for shear forces thereon in said gap.

Many other features and combinations are disclosed and claimed.

Note: This figure includes views of both the uncompressed contact (118) and the actuated contact (118a).

Figure 3:
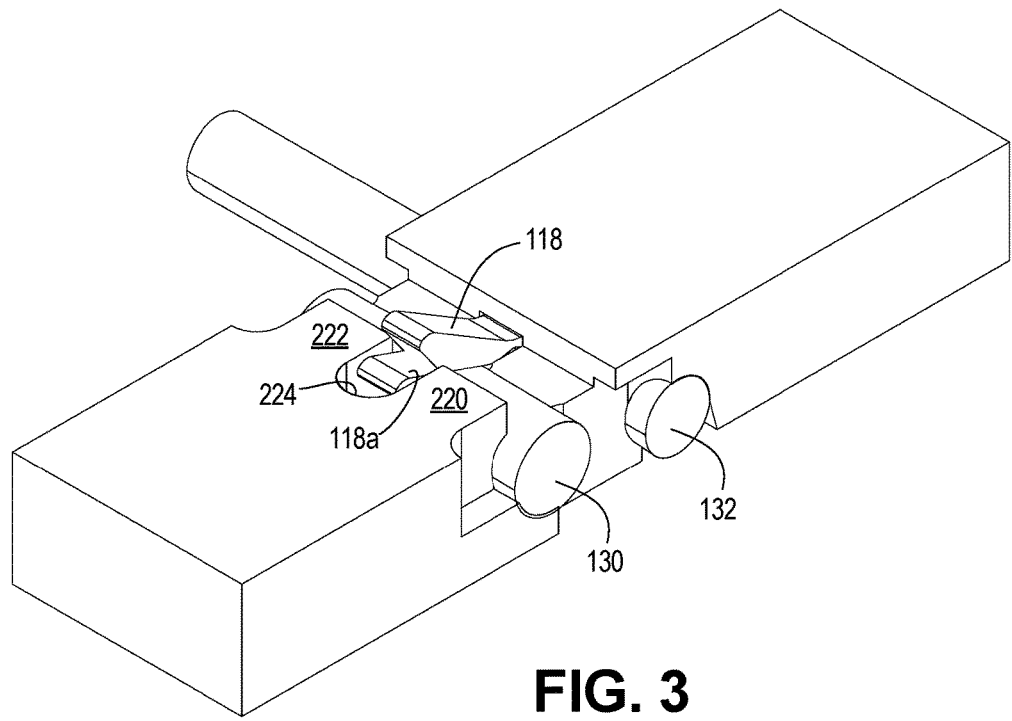
FIG. 3 is a top perspective view of a pin and housing with extended elastomers like FIG. 2 but rotated 90 degrees.
Figure 4:
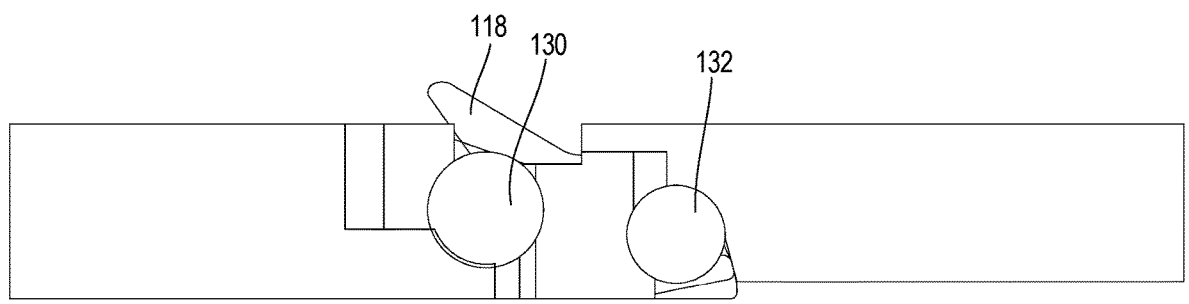

FIG. 4 is a side plan view of a pin, housing and elastomers of FIG. 3.

Figure 5:
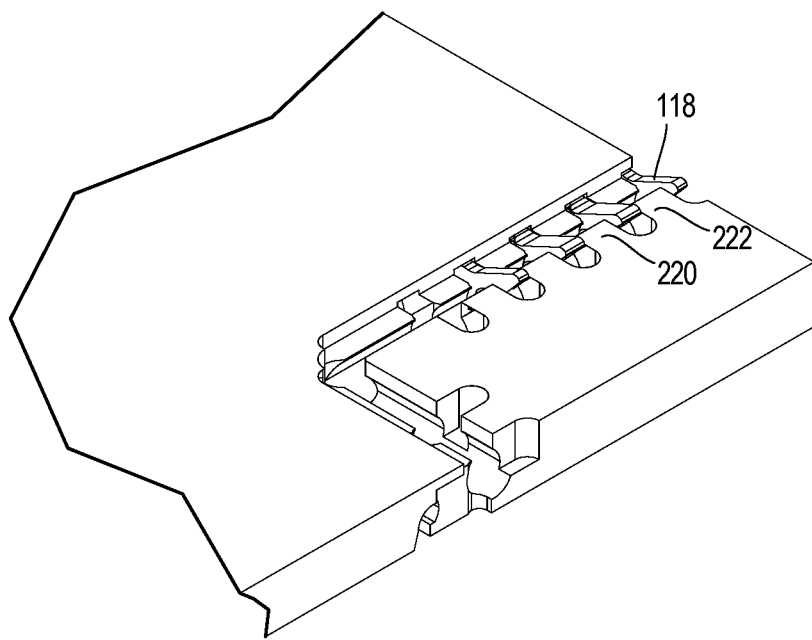

FIG. 5 is a top perspective view of a corner of a housing showing pins and pin slots in a corner.

Figure 6:
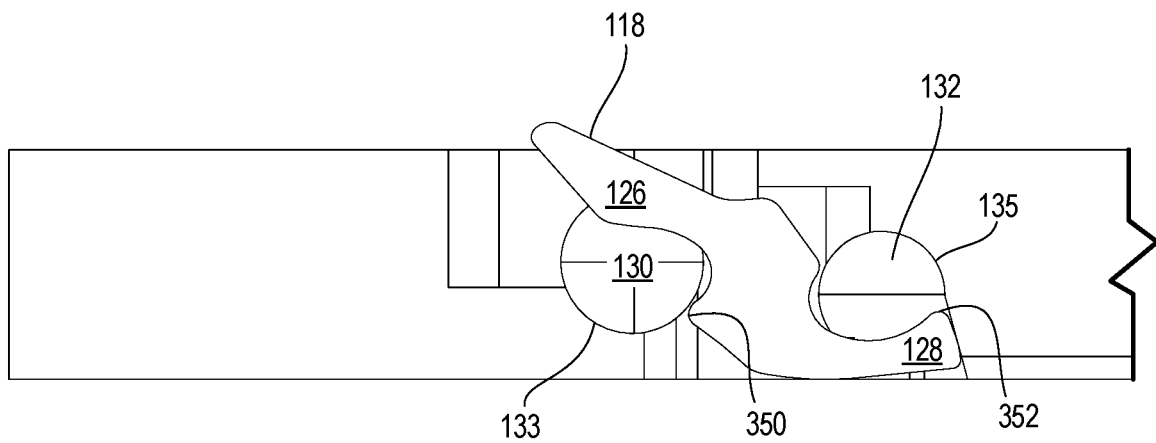

FIG. 6 is a side plan view like FIG. 4 with portions broken away to fully expose the pin.

Figure 7:
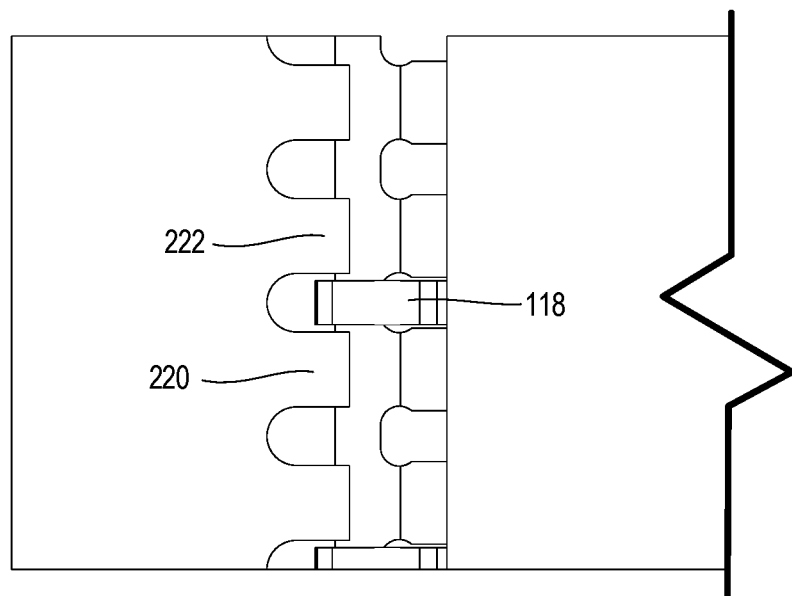

FIG. 7 is a top plan view of the subject matter of FIG. 4.

Figure 8:
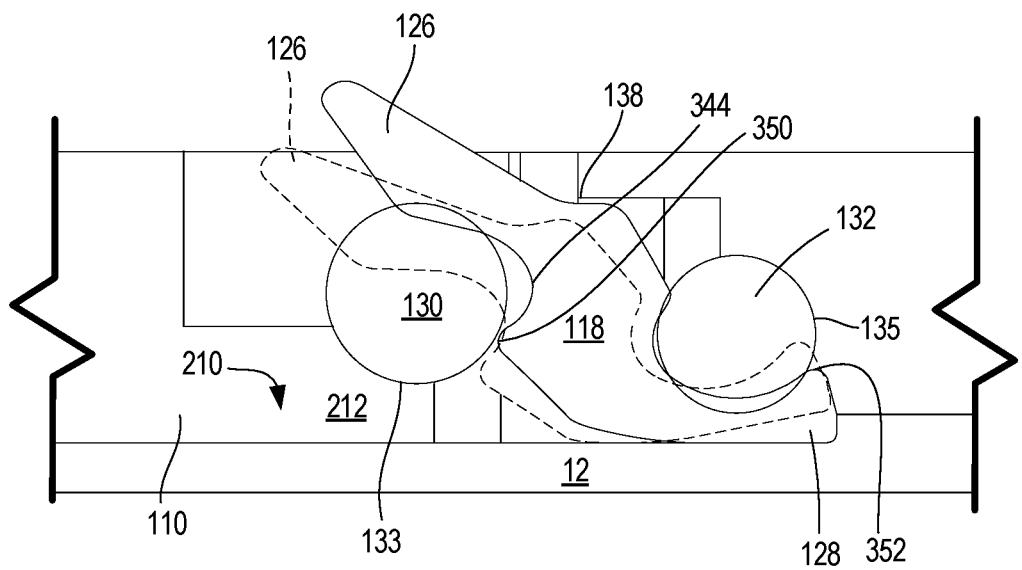

FIG. 8 is a view like FIG. 6 but showing the pin in a DUT engagement position in phantom lines.

Figure 9:
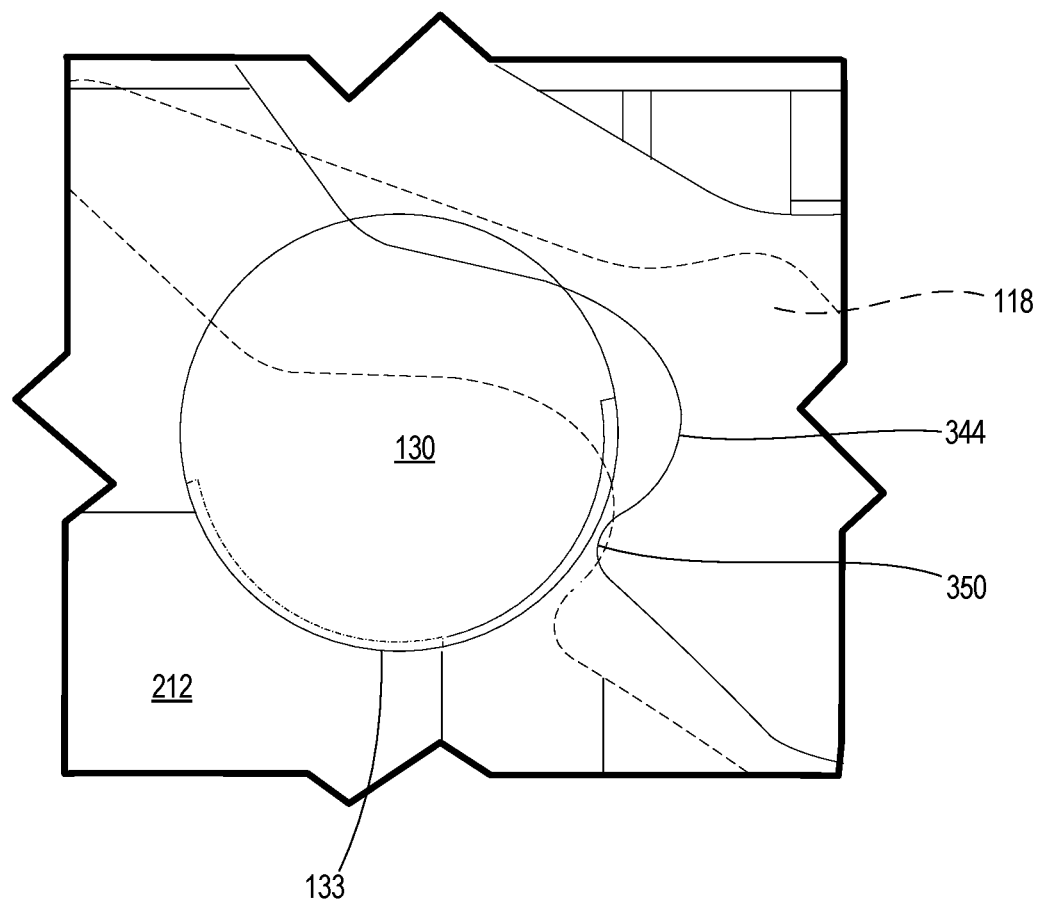

FIG. 9 is a close up fragmentary view of FIG. 8.

Figure 10:
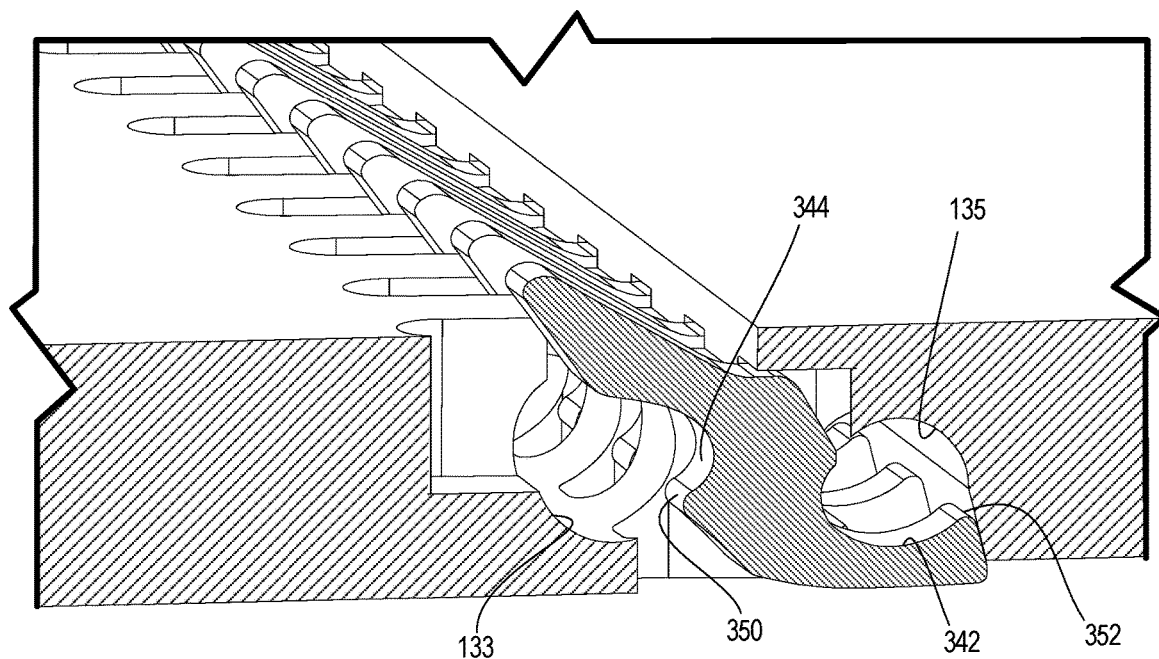

FIG. 10 is a side perspective view of a series of pins with elastomer removed according to FIG. 6.

Figure 11:
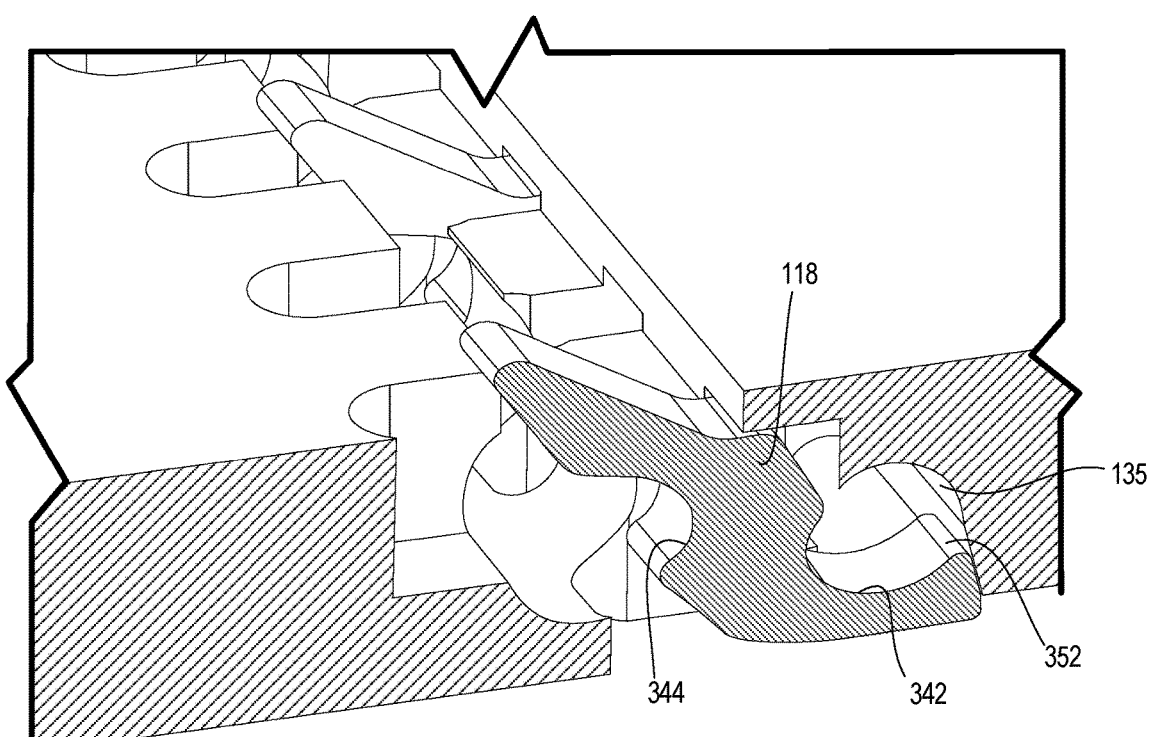

FIG. 11 is a view like FIG. 10 but close up and fragmentary with some pins removed.

Figure 12:
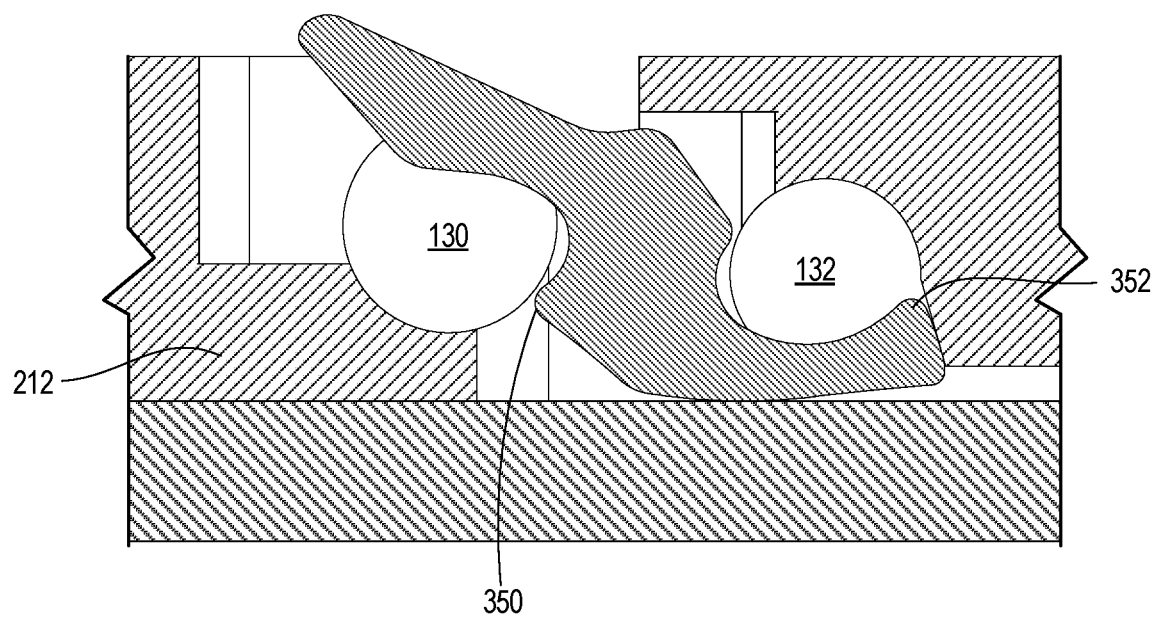

FIG. 12 is a side plan view of the subject matter in FIG. 6 with solid walls shown.

Figure 13:
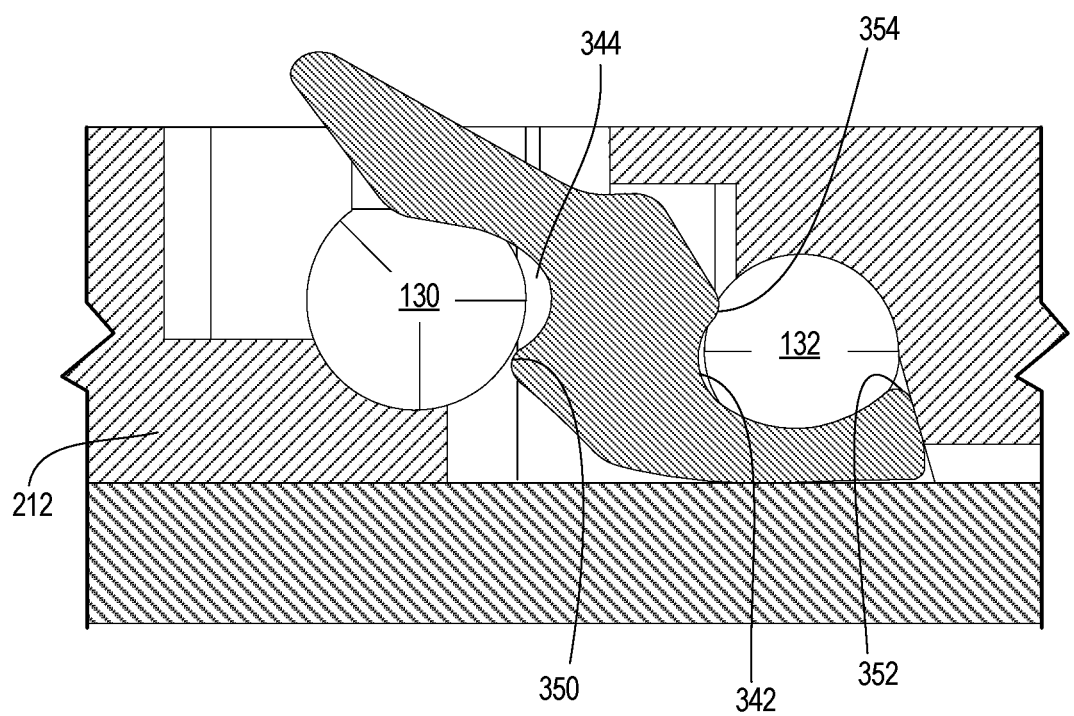

FIG. 13 is a view like FIG. 12 with the lower elastomer more fully engaged.

Figure 14:
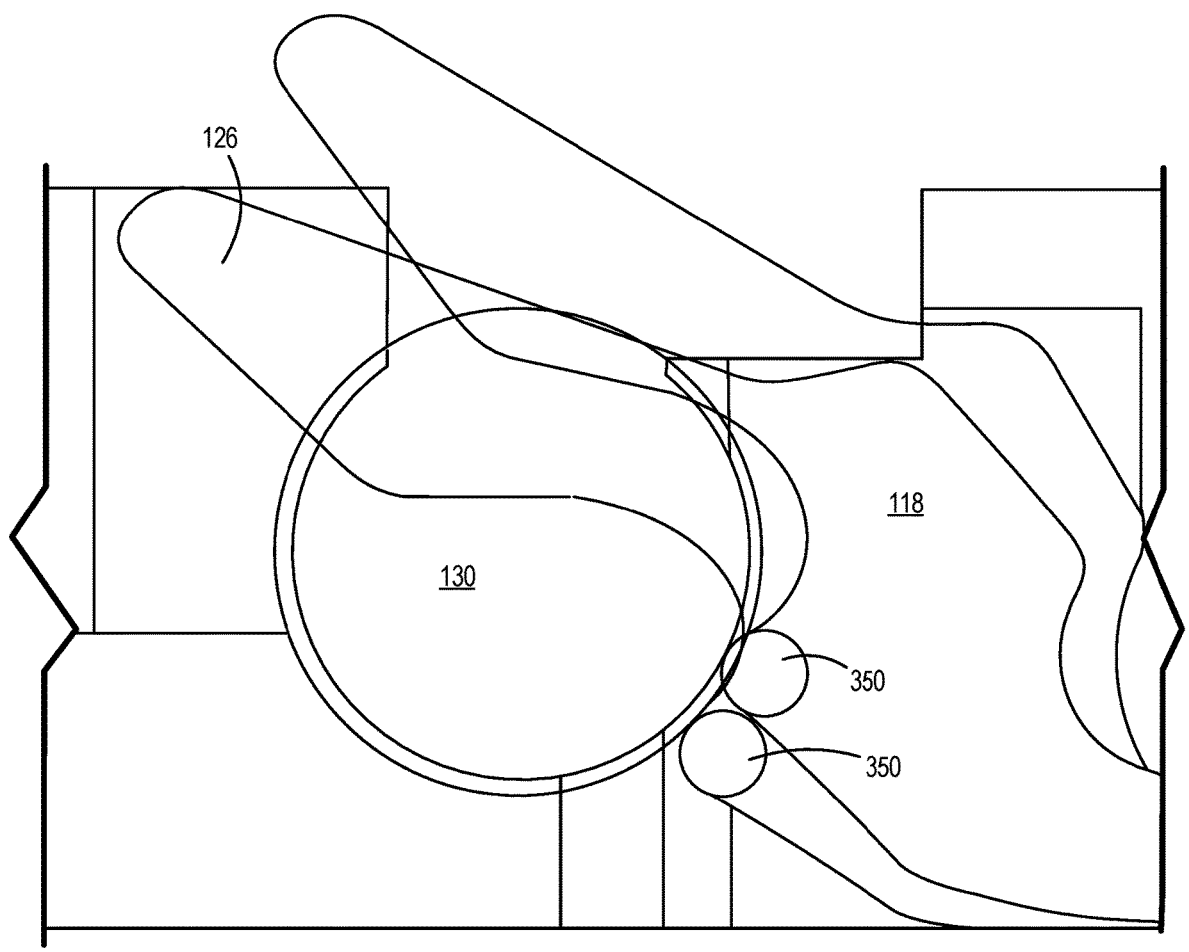

FIG. 14 is a close up partial view of FIG. 8 with two pins partially visible and with rounded tips 350 with circles to increase visibility in the figure.

Figure 15:
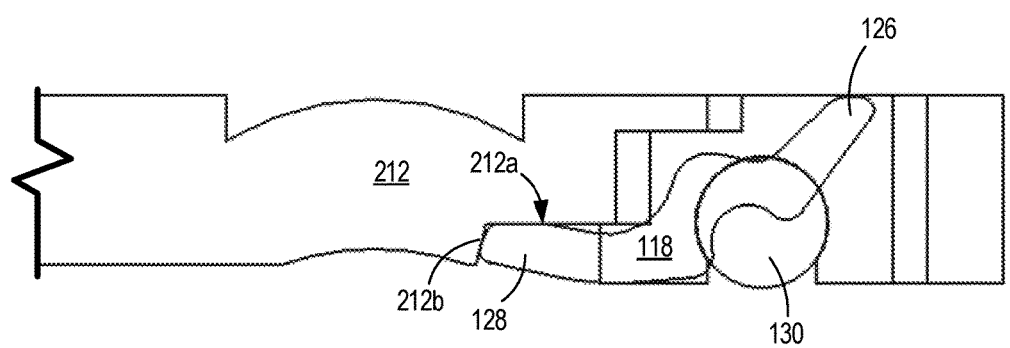

FIG. 15 is a side plan view of an alternate embodiment with a single elastomer (no rear elastomer) and the tail end of the 128 using an alternative housing shape 212 which is designed to flex, as a stop and the elastomer shown in phantom lines.

Figure 16:
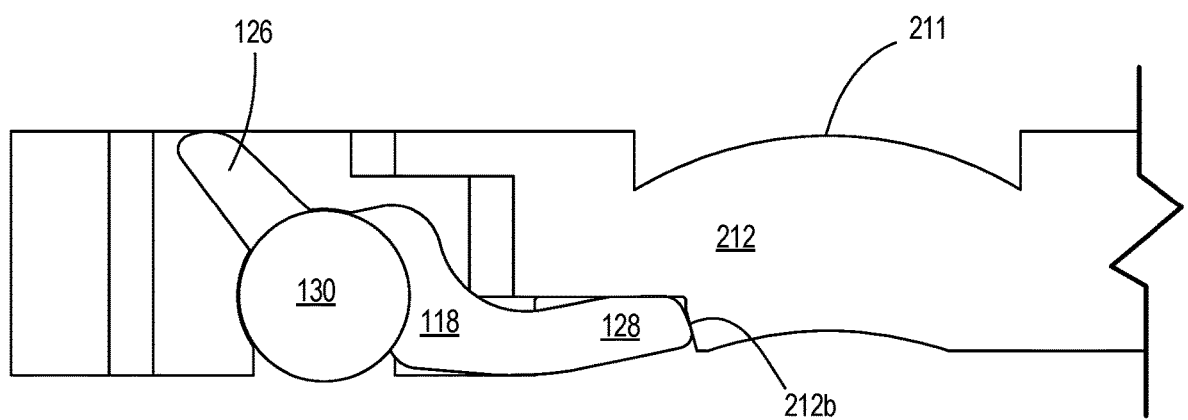
Figure 16A:
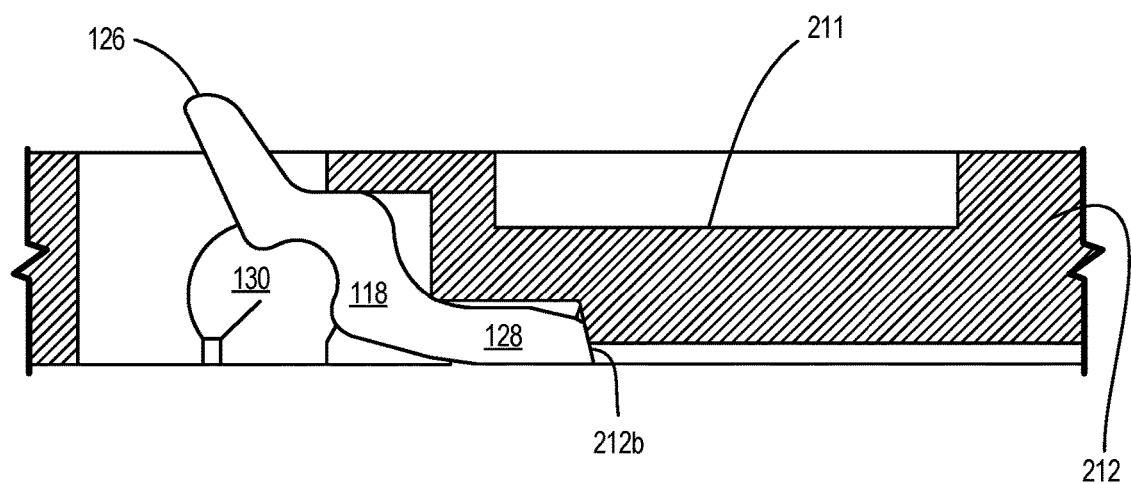
Figure 16B:
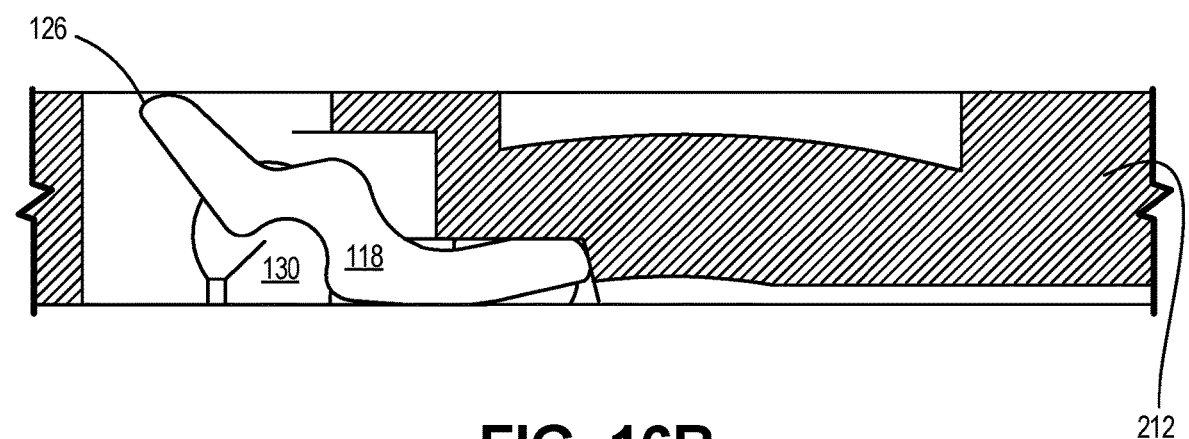

FIGS. 16, 16A, and 16B are views like FIG. 15 with the elastomer shown solid in FIG. 16 and omitted in FIG. 16A, where FIG. 16A shows the housing before pin deflection in response to the DUT and FIGS. 16 and 16B show housing deflection after pin deflection.

Figure 17:
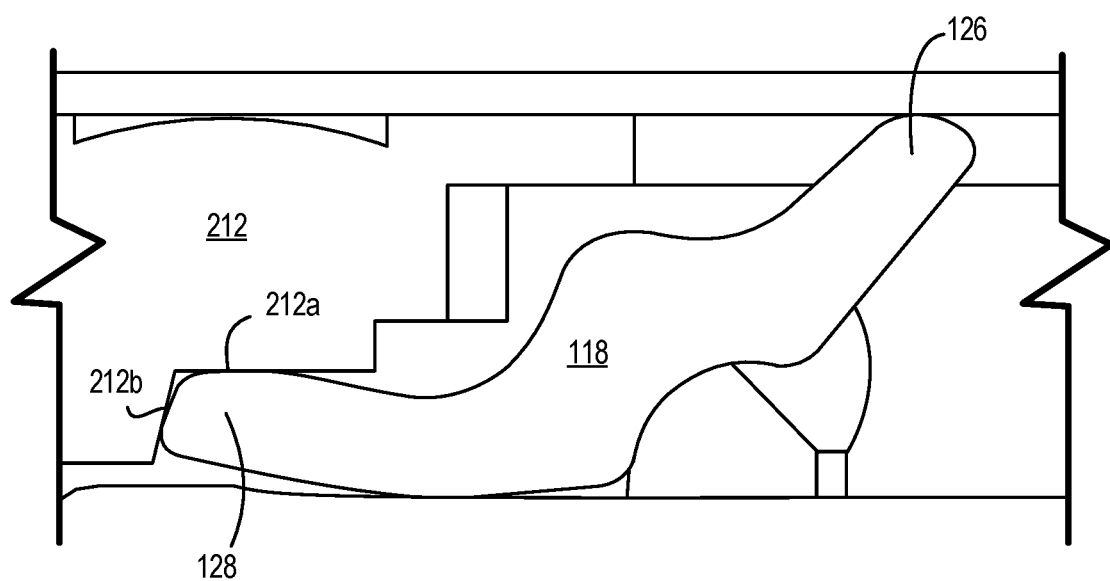

FIG. 17 is a view like FIG. 16 with the elastomer removed.

Figure 18:
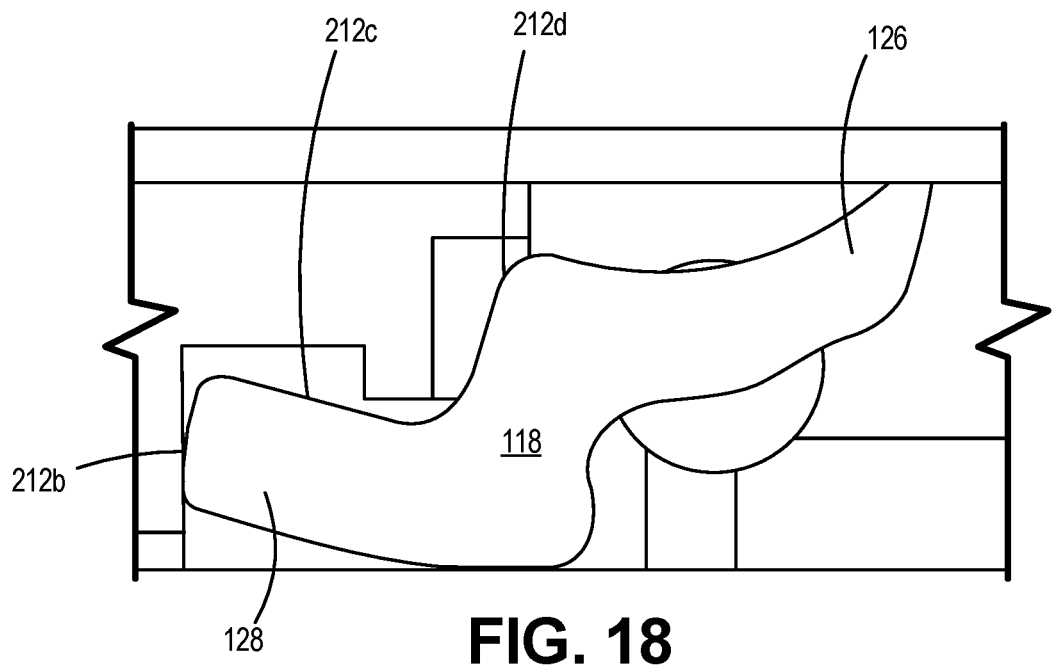

FIG. 18 is a view like FIG. 17 with an alternate embodiment of the pin having a vertical tail stop. There are two potentially unique ideas shown in FIGS. 18-19 that could be combined with the other ideas in the document. The vertical tail stop allows the housing to bow without the contact sliding forward or backward on the load board pads. A vertical tail stop also reduces friction and wear on the interface between the contact and housing. The 212c elastomer slot is shown as a small area. The invention could use a small and stiff elastomer in order to increase the amount of force available to push the contact down against the load board pads. This small elastomer could be used in combination with the housing serving as a second compliant member in order to produce the needed load board forces.

Figure 19:
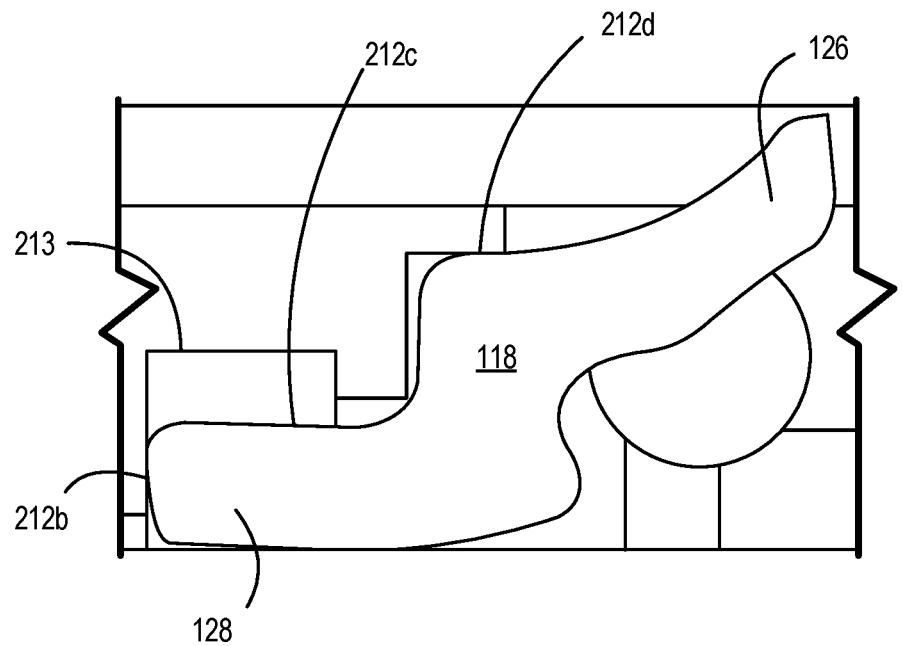

FIG. 19 is a view like FIG. 18 with a further alternative embodiment of the pin.

Figure 20:
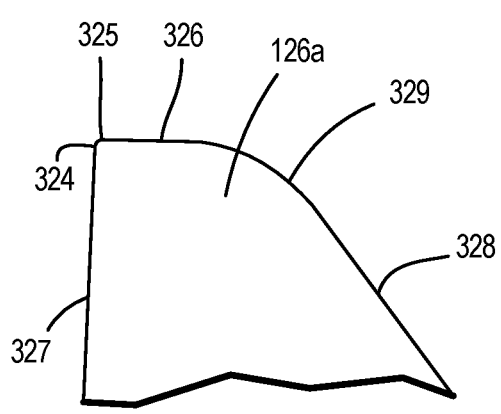

FIG. 20 is a close up fragmentary view of the top end portion 126a of pin 126.

Figure 21:
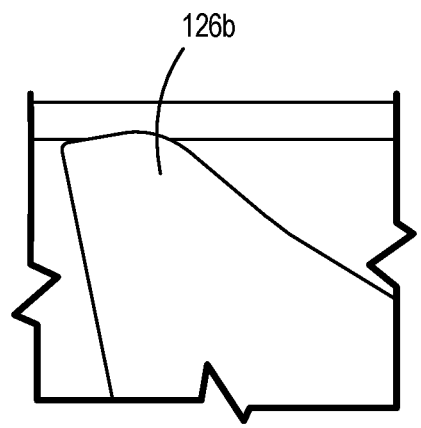

FIG. 21 is view like FIG. 20 of an alternate top end portion 126b.

Figure 22:
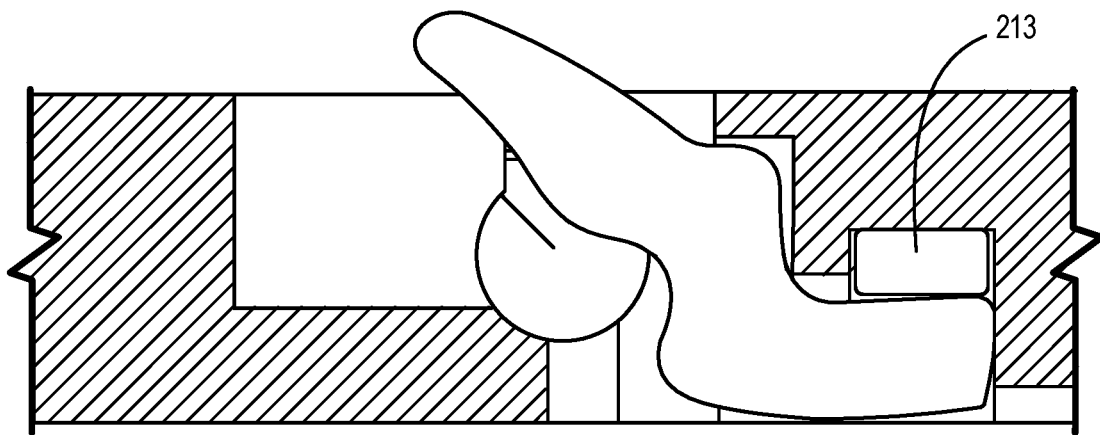

FIG. 22 is a view like FIG. 19 but with elastomer 213 visible.

Figure 23:
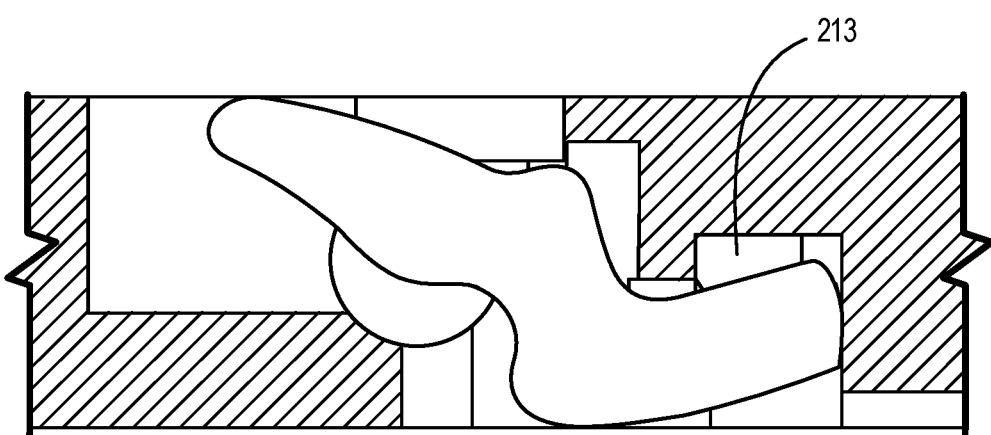

FIG. 23 is a view like FIG. 22 with elastomer 213 compressed.

Figure 24:
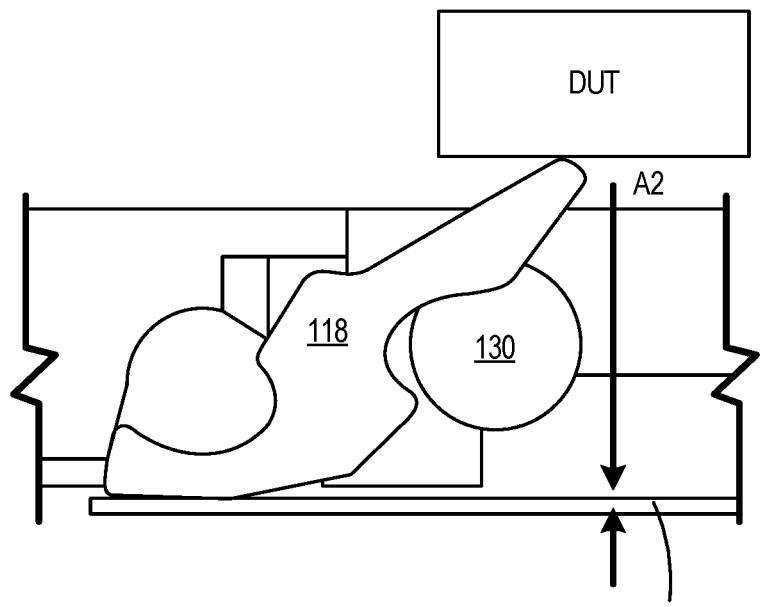

FIG. 24 is a view like FIG. 8 showing load board gap A2.

Figure 25:
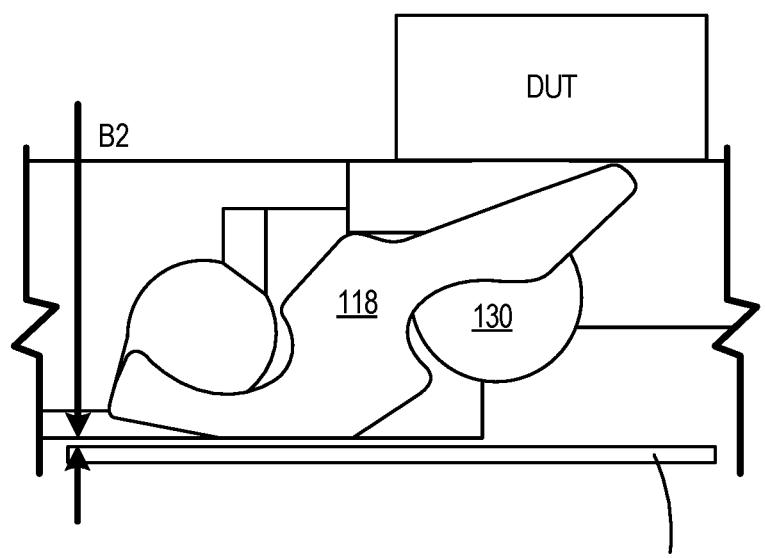

FIG. 25 is a view like FIG. 8 showing load board gap B2.

DETAILED DESCRIPTION

A prior art device is shown in our U.S. Pat. No. 7,338,293 issued to Gilk (which is incorporated by reference in its entirety).

Figure 1:
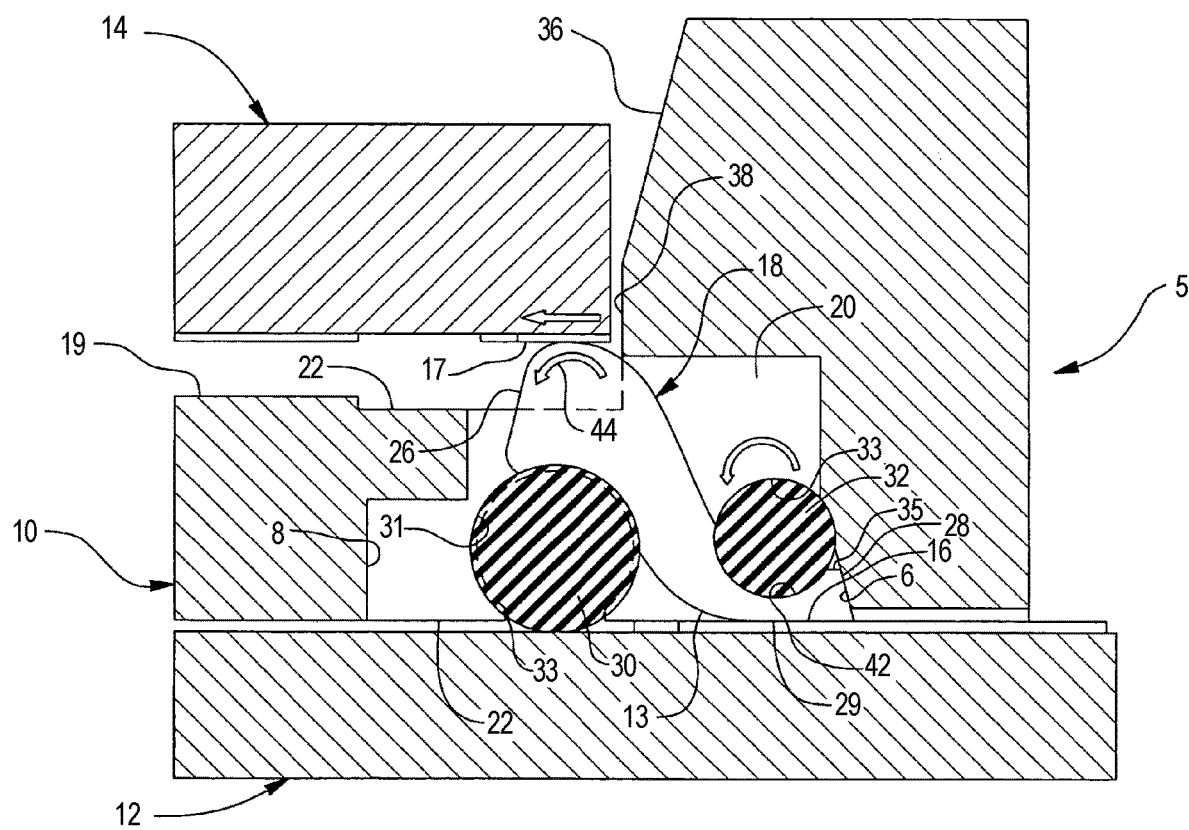
FIG. 1 is a prior art device from U.S. Pat. No. 7,338,293. The numerals thereon conform to that '293 patent.
Figure 2:
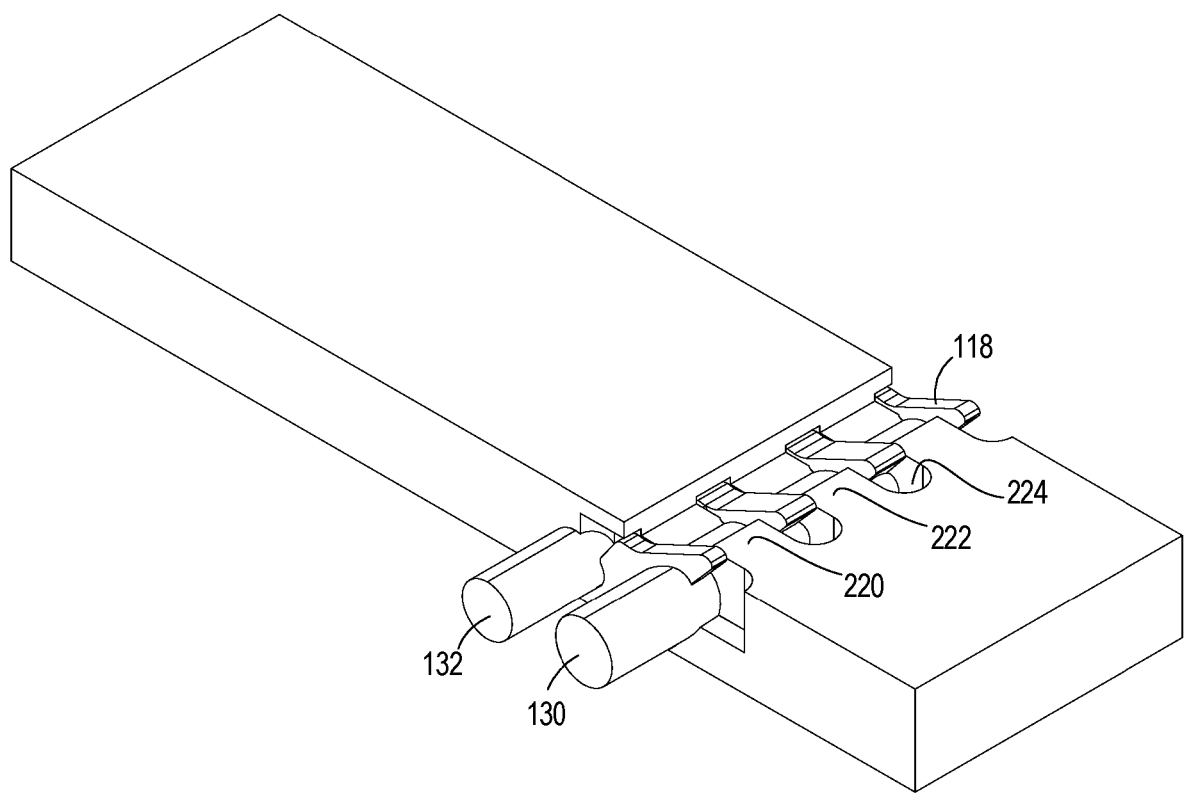
FIG. 2 is a top perspective view of a pin and housing with extended elastomers.

FIG. 1 shows a prior art contactor assembly 5 from the above '293 patent, mounted in a housing 10. Housing 10 has generally planar, parallel opposed sides 22 essentially at right angles to pairs of opposed edges. Housing 10 is configured to effect electrical connection of an integrated circuit device (DUT) 14 to a load board 12. Device 14 has leads 17 and load board 12 has terminals or pads 16 which are electrically connected by contacts 18 mounted within housing 10.

Parallel sides of housing 10 bound generally equally spaced parallel slots 20, each for receiving a corresponding contact 18 therein. Each slot 20, it is intended, contains a contact/pin 18. Contacts/pins 18 are thin with generally planar surfaces. Each has a nose end 26 and a tail end 28 which together define an essentially "S" shaped structure. Nose end 26 is, as illustrated, larger than tail end 28 to provide a greater outward extension to protrude from housing 10 beyond one side to contact leads 17 of device 14. Tail end 28 has a linear portion 29 to provide a positive electrical connection to terminals 16 of lead board 12.

Generally tubular shaped channels 31 and 33 extend through housing 10 along axes generally perpendicular to planes defined by slots 20 with front channel 31 being larger than rear channel 33 to better conform to the corresponding concave portion of edges of engaged nose ends 26 and tail ends 28. A cylindrical shaped front elastomer 30 is received within front channel 31, and a cylindrical shaped rear elastomer 32 is received within rear channel 33.

Nose end 26 has a concave inner edge 25 which engages and bears against front elastomer 30. Similarly, tail end 28 has a concave inner edge 42 which engages and bears against rear elastomer 32. Front channel 31 and rear channel 33 have corresponding communicating apertures 33, 35 extending through to load board 12. Proximate sides of channels 33, 35 are spaced closer than distances the same as the diameters of their respective channels 31, 33. This permits inserting elastomers 30 and 32 into channels 31, 33 by urging them through their respective apertures 33, 35. Elastomers 30, 32 are thereby retained in place.

The portion of the alignor 26 opposite contacts 18 defines a stop 38. The alignor 36 locates an edge of DUT 14 such that its leads 17 are opposite the outward extensions of corresponding nose ends 26 of contacts 18, and also orients the leads 17 parallel to the contacts 18. Stop 38 also limits the outward extension of contacts 18.

In order to accommodate higher frequencies, it is necessary to reduce the housing thickness. For more densely packed pin arrays on the DUT, it is necessary to thin the housing walls. The remaining figures are directed to this thin housing and/or thin walled structure.

In the preferred embodiment this design has a housing thickness of 0.5 mm, which is less than half the thickness of prior designs (1.3 mm). Such a thin housing (0.5 mm) requires very little force to bend and thus this modified structure is needed. As new devices operate at higher frequencies, even thinner housings will be required. Housings may need to be made 0.4 mm or even 0.3 mm thick to achieve certain performance requirements.

The thin housing can easily flex and bow which causes mechanical issues of consistency and reliability over life.

To limit bow, several solutions may be incorporated.

The front elastomer slot is accessed through the top of the housing and is constructed to capture force from the front elastomer to flatten the housing, while minimizing wear on the front elastomer.

FIGS. 2-15 use numbering consistent with FIG. 1 except increased by 100, where appropriate.

The structure shown in FIGS. 2-14, 18 and 19 self flattens. As the device under test is brought closer to load board (12 in FIG. 1), the housing bows upwards, due to force from the tail 128 of the contact on the rear elastomer 132 lifting upwards while the nose 126 and front elastomer 130 exert force in the direction of arrow 210 against housing support portion 212. Portion 212 may be a flexible material or may be thinner than other parts of the housing to be more flexible or it may have a convex upper surface and/or concave lower surface to give it greater flexibility. It may also just be long enough to provide flexure without being thinner. The housing support portion is the portion beneath the channel sized to receive a portion of said bias element. The channel extends from said upper surface of the housing toward but a predetermined distance from the lower surface, thereby defining a housing support portion at the bottom of said channel.

Housing support portion 212, which is not present in prior art, prevents a gap from being created between the housing 110 and the load board 12. The size of the gap depends upon where the fasteners are located, what type of alignment plate (if any) is used, and more factors. Therefore the gap is different for contacts in the same contactor, but gaps are undesirable and variable gaps are worse.

With an inconsistent gap between the housing 110 and the load board (12 in FIG. 1) it is difficult to design a contact that has consistent force and motion relative to the device under test and the load board.

The structure shown in FIGS. 6 and 8, for example, self flattens/remains flatter than a scaled down version of previous technology as it is actuated. As the device under test 14 is brought closer to the load board 12, the housing does not bow upwards. The force from the tail of the contact on the rear elastomer does provide an upward force on the elastomer. However, it doesn't lift the housing due to a downward force on the front elastomer 130. The barrier wall 212 which is part of the housing 110 is interposed between the load board 12 and elastomer 130.

The nose 126 of contact/pin 117 compresses the front elastomer which applies a downward force on the housing of a magnitude large enough to prevent the housing from bowing significantly.

By eliminating the significant gap, the motion and forces of the contact are more consistent for all of the contacts in the contactor. A more consistent electrical test and a longer mechanical life become possible.

In the embodiment of FIGS. 2-14, 18 and 19, the channel 133 is arcuate and which receives the front elastomer 130 is cut/formed in housing 110 for top insertion, unlike in the FIG. 1. This, plus barrier way 210 interposed between the load board and elastomer 130 prevent deflection and thus bowing of the housing. Barrier 210 also provides a bridge between the two sidewalls 220/222 which define slot 224 for the pin 118 (See FIG. 3). The bottom elastomer 132 is inserted from underneath up to channel 133.

Partially supporting the elastomer allows it to experience a mixture of compressive and shear stresses. The shear force helps provide greater compliance to the elastomer, but the compressive forces help prevent the elastomer from tearing by supporting the elastomer.

In the preferred embodiment, channel 133 is formed in the housing with only a portion of elastomer 130 being supported by this arcuate portion. This supporting portion is approximately/generally 20%, 25%, 30%, 33%, 45%, 49%, or less than half of the entire circumference of the elastomer, if more searing forces are desired or generally greater than 50%, 60%, and 75% of the entire circumference of the elastomer if great compressive forces are desired. ("Generally" is defined as not necessarily the exact number, but close). The supported part of the elastomer imparts a compressive force therein. The unsupported part creates a shearing force in the elastomer. It is advantageous to limit the compressive force because, the elastomer is not entirely compressible and shear force expansion provides a more linear response to pin deflection by the DUT than if the elastomer was more than half surrounded by a confining channel. In that case, the compressive forces rise non-linearly and the pin is not equally resilient when deflected.

Because the pins are thinner, there is a need to adapt the channel for managing the compressive forces on the elastomer. That also makes it easier for the elastomer to become dislodged from the channel and getting out of proper position.

If the channel or pin recess more fully surrounded the elastomer, compressive forces on the elastomer may distort the pins under compression. Thus allowing for expansion space is preferred.

Both the front and rear channels and elastomers can be subject to this issue.

A solution shown in FIGS. 6, 8 and 9-13 create a special curvature in elastomer recesses 342 and 344 in pin 118. The basic curvatures are arcuate generally in the same shape of the elastomer, though preferably equal to or slightly smaller than the uncompressed elastomer diameter. The arcuate portion terminates in capture or retaining protrusions 350, 352, 354, preferably cylindrical (see FIG. 13). Only one is shown on the upper recess but both are possible. This protrusion impinges/engages on the elastomer at one or both ends of the recess thereby tending to capture it within the recess. These retaining protrusions may be of other shapes, such as bumps or be a narrowing of the arcuate shape at the ends to require that the elastomers cannot fall out when not under compression. In effect, the arcuate or curved portions in the housing which receive the elastomer have an open face which includes a constriction in the distal ends of the face. The constriction creates a retainer which keeps the elastomer seated in the pin recess so that it does not become dislodged when a DUT is inserted or removed from the housing. In the preferred embodiment, the circumference of the arcuate portions 342 and 344 are less than half of the circumference of the elastomer and in any case the circumference of these arcuate portions and channel 133 in the housing will be less than 100% of the elastomer circumference to insure that there is shear space for the elastomer. In practice it may be much less than 100%, such as 90, 85, 80, 75, 70, 65, 60, 50, or other lesser percentages, to allow more shear space.

It is also possible to apply capture protrusions on the housing channels instead of, or in addition to, the protrusions on the arcuate portions of the housing or pin. The protrusion can be placed anywhere on the channel but preferably adjacent the upper end.

In another feature of the disclosure, the pin slots are not fully cut away, leaving additional housing material to support the front elastomer in the pin/contact slot.

FIG. 14 is a close up view of portions of FIG. 8 with rounded protrusions 350 shown accentuated/enhanced by showing completed circles.

FIGS. 15-21 illustrate an alternate embodiment with a single elastomer 130 and housing 212 configured to engage the tail 128 of pin 118 to engage the housing as a stop. In FIG. 15, the tail engaged a horizontal portion 212a of the housing as well as a vertical wall 212b. Portion 212 extends from and past the distal end of the tail as shown. Horizontal portion/all 212a overlies at least a portion of tail 128 and created a pocket therefore. Wall 212b may be set at an angle off the vertical as shown. In this embodiment there is no rear elastomer because the housing is preferably designed to flex very slightly and provide the compliance required. It will have little or no preload. However, the reason for eliminating the rear elastomer is that the housing is stiffer than an elastomer. Since with a very thin housing the contacts cannot be preloaded against the load board with very much force, using the housing as a compliant member has an advantage in that the force applied to the contact will ramp up more rapidly as the contact is actuated compared to the force an elastomer can apply. FIGS. 22-23 illustrate elastomer (pad/pillow) 213 which fills the space 212c so that when pin tip 126 is deflected by the DUT, it immediately engages elastomer 213 and defects it. Elastomer 213 is shown as not fully filling the space/recess available before deflection. It could also fully fill the space, but if not, when the pin tail deflects the space may be filled by the elastomer thereby increasing its resistance to deflection. This would create a non-linear deflection vs force curve which may be desirable in some cases.

FIGS. 16 and 16A illustrate the defection which pin tail 128 makes in the housing when the pin is deflected by DUT insertion. Notice housing portion 211 is planar in its rest state but becomes bowed (exaggerated in the figure) in response to engagement of the tail 128. In short, the housing is compliant, i.e. flexible to provide the benefits of a housing but also some of the benefits of an elastomer, without the complications of adding the additional elastomer.

In FIGS. 18-19, the stop is limited to wall 212b as a portion of the housing 212c is removed forming a cavity capable of allowing part of the tail to enter that void. The contactor design depicted in FIGS. 18 and 19 is intended to have a small and thin rear elastomer in the cavity 212C. As described earlier the tail stop 212b is vertical, which prevents the contact from sliding left or right (laterally) when the housing moves up and down, thus reducing load board pad wear. The vertical tail stop also reduces the frictional forces between the housing and contact, reducing wear on the contacts and housing. A pad elastomer 213 shown optionally in FIG. 18 is preferably thin so that it will apply more downward force to the contact more quickly as the contact is actuated. There is also a wall (not labeled in the figures) between the rear elastomer 213 and the contact 118 that captures the rear elastomer on a third side. With the rear elastomer more completely surrounded by the housing, the force from the rear elastomer will be increased.

In FIGS. 18 and 19 the vertical tail stop 212b allows the housing to bow (shown at 211 in FIG. 16A) without the contact sliding forward or backward on the load board pads. A vertical tail stop is a vertical wall which the pin tail engages, which reduces friction and wear on the interface between the contact and housing. The 212c elastomer slot is shown as a small area. The embodiment preferably uses a small and stiff elastomer in order to increase the amount of force available to push the contact down against the load board pads. This small elastomer could be used in combination with the housing deflection (211) serving as a second compliant member in order to produce the needed forces to keep the pin in solid contact with the load board, but without excessive pressure which would either damage the pin, housing or load board.

Likewise an upstop 212d is provided in the housing to engage the middle portion of the pin between the head and tail. It is preferably a horizontal wall which engages part of the pin between the tip and end.

FIG. 20 illustrates an alternative embodiment for upper pin tip ends 126a and 126b. The pin is preferably preloaded (i.e. preloading means that the pin would be under initial bias force tension) because the housing is very thin. For that reason, the initial force applied to the device pad by the contact tip is very low. The contact needs to be able to clean itself and clean oxides from the device pad surface despite such a low force. Therefore the first edge 324/325 that touches the device pad is sharper than prior art and the angle of surface 327 is designed to help the contact clean oxides from the pad even at extremely low forces. As the contact is actuated, the flat 326 serves as a transition to the rear radius 329. The flat 326 may be present in some versions of this invention, but in other versions there is no flat surface. That is, the rear, larger radius 329 may be directly tangent to the sharp corner 324/325. The rear, larger radius 329 touches the device pad when the contact is fully compressed. The function of the larger radius is to make the final electrical connection to the device pad when the contact is fully actuated. The back radius 326 is not as sharp as 325 to make good electrical contact after the cleaning action of edge 325. The front tip corner 324 adjacent 325 is sharp. The front wall 327 is at a slight angle and can be selected to produce the right balance between cutting and sliding.

FIG. 21 illustrates the pin tip in a compressed state in FIG. 20 while engaged with the pad/ball of a DUT.

FIGS. 24-25 show how the housing 12 remains largely stable in response to pin pressure and the gap A2/B2 remains fixed. In prior devices, this bowing effect would increase the gap and cause load board wear, which is highly undesirable.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. An apparatus for electrically connecting a lead of an integrated circuit device to be tested (DUT) to a corresponding terminal of a load board at a test site, while reducing deforming stress on a lower surface of a housing which creates a gap between the lower surface and the load board, comprising:
   a. a self-flattening housing having upper and lower surfaces, a first surface approachable by an integrated circuit device under test (DUT) to be tested and a second surface proximate the load board;
   b. a slot extending through said housing from the first surface to the second surface;
   c. a pin contact receivable in said slot having a first end engagable with the DUT and a second end in engagement with the terminal of the load board, said pin contact being movable between a first orientation unengaged with the DUT and a second orientation in which said first end of said contact is engaged by the DUT;
   d. at least one elastomeric bias element having a circumferential exterior surface which has a bottommost region;
   e. said pin contact including an arcuate recess therein sized generally to receive a portion of said bias element;
   f. said housing including a channel sized to receive a portion of said bias element, said channel located between said upper surface and said lower surface, thereby defining a housing support at the bottom of said channel;
   g. said housing including a rigid support barrier element spanning said channel and being a part of the housing which supports said elastomeric bias element; said barrier element being located toward the lower surface of the housing; said barrier element having a portion with an arcuate shape surface positioned underneath at least the bottommost region of said elastomer for supporting part of said elastomeric biasing element, so that the barrier element may receive forces from the elastomeric biasing element and prevent the housing from bowing in response to said forces when said pin is deflected by engagement with a DUT.

2. The apparatus of claim 1 wherein said bias element has a non-linear force response to engagement with said pin.

3. The apparatus of claim 1 wherein said barrier element is formed to support at least twenty five percent of the entire elastomer circumferential surface and also the bottommost region of said elastomer circumferential surface, so that forces applied to the barrier through the pin and elastomer will tend to self-flatten the housing.

4. The apparatus of claim 3 wherein said barrier element is formed to support at least twenty five percent but less than half of the entire elastomer circumferential surface and also the bottommost region of said elastomer circumferential surface, so that forces applied to the barrier through the pin and elastomer will tend to self-flatten the housing.

5. The apparatus of claim 3 wherein said elastomer is cylindrical.

6. The apparatus of claim 3 wherein said arcuate portion is a concave portion adjacent to the load board.

7. An apparatus for electrically connecting a lead of an integrated circuit device to be tested (DUT) to a corresponding terminal of a load board at a test site, while reducing deforming stress on a housing, which will otherwise ten to create a gap between the housing and the load board, comprising:
   a. a housing having upper and lower surfaces, a first surface approachable by an integrated circuit device under test (DUT) to be tested and a second surface proximate the load board;
   b. a slot extending through said housing from the first surface to the second surface;
   c. a pin contact receivable in said slot having a first end engagable by the lead and a second tail end in engagement with the terminal, said pin contact being movable between a first orientation unengaged by the lead of the integrated circuit and a second orientation in which said first end of said contact is engaged by the lead of the integrated circuit and urged into said slot;
   d. at least one cylindrical elastomeric bias element, the element having a circumferential exterior surface and a bottommost region on said exterior surface;
   e. said housing including a channel sized to receive a portion of said bias element, said channel including a support barrier element positioned underneath at least the bottommost region of said elastomer, so that when said pin engages said elastomer, forces applied to the barrier element will tend to self-flatten the housing and prevent it from separating from the load board.

8. The apparatus of claim 7 further including a recess in the housing extending into the bottom surface for receiving and engaging a portion of said tail end when said pin is engaged by the DUT, the housing adjacent said recess being deflectable in response to engagement of said tail end;

so that when said recess is deflected in response to pin movement, the housing will compress and contact between the housing and the load board is maintained despite pressure from the pin on the load board.

9. The apparatus of claim 8 wherein said recess includes an elastomer pad configured to engage at least a portion of said tail end when said pin is deflected by the DUT, thereby providing compression in the housing.

10. The apparatus of claim 8 wherein said recess includes an elastomer pad configured to engage at least a portion of said tail end when said pin is deflected by the DUT and where the elastomer pad resides in said recess but is smaller than said recess until engaged by said tail end, thereby expanding the elastomer to fill the recesses space.

11. The apparatus of claim 8 wherein said recess includes an elastomer pad and wherein the elastomer has a non-linear force response to engagement with said tail end.

12. The apparatus of claim 7 wherein said housing adjacent said recess includes a flexible portion.

13. The apparatus of claim 7 wherein said flexible portion includes an arcuate portion.

14. The apparatus of claim 7 wherein said arcuate portion is a concave portion adjacent to the load board.

15. Method of making an integrated circuit testing device which connects terminals on a device under test (DUT) to a corresponding terminal of a load board at a test site, comprising the steps of:
   a. forming a housing having upper and lower surfaces, a first surface approachable by an integrated circuit device under test (DUT) to be tested and a second surface proximate the load board;
   b. forming a slot extending through said housing from the first surface to the second surface;
   c. inserting a pin contact in said slot having a first end engagable by the lead and a second end in engagement with the terminal, said pin contact being movable between a first orientation unengaged by the lead of the integrated circuit and a second orientation in which said first end of said contact is engaged by the lead of the integrated circuit and urged into said slot;
   d. forming at least one elastomeric bias element;
   e. forming an arcuate recess in said pin contact and sizing it generally to receive a portion of said bias element, forming distal terminations at ends of the recess, at least one of said terminations including a projection which narrows the opening of the recess, thereby providing a retainer to maintain the pin within the housing.

* * * * *